United States Patent [19]

Quenisset et al.

[11] 4,176,002
[45] Nov. 27, 1979

[54] CONTROLLING THE MELT TEMPERATURE DURING ZONE REFINING AND CZOCHRALSKI CRYSTAL GROWTH BY SENSING THE VISCOUS TORQUE OF THE MELT ZONE DURING OPERATION

[75] Inventors: Jean-Michel Quenisset; Rober Naslain; Paul Hagenmuller, all of Talence, France

[73] Assignee: Agence Nationale de Valorisation de la Recherche (ANVAR), Neuilly sur Seine, France

[21] Appl. No.: 785,184

[22] Filed: Apr. 6, 1977

Related U.S. Application Data

[63] Continuation of Ser. No. 605,343, Aug. 18, 1975, abandoned.

[30] Foreign Application Priority Data

Aug. 21, 1974 [FR] France .............................. 74 28762

[51] Int. Cl.² .......................... B01J 17/10; B01J 17/18
[52] U.S. Cl. ................................ 156/601; 156/617 SP; 156/618; 156/620; 422/249; 422/250
[58] Field of Search ............. 23/273; 156/601, 617 SP, 156/617 M, 620, 618; 422/248, 249, 250, 245

[56] References Cited

U.S. PATENT DOCUMENTS

| 2,992,311 | 7/1961 | Keller ................................. 156/601 |
| 3,009,973 | 11/1961 | Erneis ................................ 156/620 |
| 3,046,379 | 7/1962 | Keller et al. ...................... 156/601 X |
| 3,270,177 | 8/1966 | Prediger ............................. 156/620 |
| 3,880,599 | 4/1975 | Keller ................................. 156/601 |

FOREIGN PATENT DOCUMENTS 911515 11/1962 United Kingdom ..................... 156/620

Primary Examiner—Stephen J. Emery
Attorney, Agent, or Firm—Hammond & Littell

[57] ABSTRACT

A method and apparatus for controlling a heated bath of molten material to obtain controlled solidification, wherein the molten bath is kept in constant rotational movement relative to the solid portion of the material being treated and the mechanical action due to the viscous friction which develops in the bath is detected and thereby controlled, said method being applicable to the floating zone method and the Czochralsky crystal drawing method and being capable of producing ingots of high dimensional regularity.

12 Claims, 3 Drawing Figures

CONTROLLING THE MELT TEMPERATURE DURING ZONE REFINING AND CZOCHRALSKI CRYSTAL GROWTH BY SENSING THE VISCOUS TORQUE OF THE MELT ZONE DURING OPERATION

This is a continuation, of Ser. No. 605,343, filed Aug. 18, 1975, now abandoned.

The present invention relates to a method for controlling a bath of molten material, making use of mechanical action resulting from the viscous friction which may develop in such a bath; the invention also relates to apparatus for carrying out the method, particularly for obtaining directional solidification.

In practice, the use of certain techniques of controlled solidification, such as, for example, melting zone purification or preparation of composite materials as directionally solidified entectic alloys often raises ticklish problems associated with possible contamination due to the container, when chemically reactive liquids are treated, this reactivity being much greater at high temperatures.

In order to eliminate any risk of pollution or contamination of the solidified product caused by the container, numerous writers have recommended a method of localized melting in a floating zone in slow translatory movement along the main axis of the solid bar or ingot being treated. In such a melting zone purification technique, the liquid phase (the molten zone) is kept in equilibrium between two solid parts of the ingot solely by the action of surface tension, with which external forces, for example, those due to an electromagnetic field, may nevertheless be associated. It follows therefore that the only possible source of pollution is then the gaseous atmosphere present inside the apparatus. So, the floating melting zone technique, generally applied with the main axis of the ingot vertical, may be used regardless of the melting temperature of the material to be purified and the chemical reactivity of the viscous liquid in the floating zone owing to the fact that all direct contact between the material being treated and the container has been eliminated.

However, despite such a manifest advantage, directional solidification techniques have up to now been limited in their industrial development by the arduous problems of control systems that have to be overcome. Indeed, the zone of molten material must be held in suspension simultaneously with the slow translatory movement and at the same time rigorously supervised to maintain the characteristic parameters of the zone constant, viz, its shape and volume. Thus numerous complex apparatus have been proposed and utilized which make use of optical and radiation controls, but they are all very expensive and difficult to operate satisfactorily. By way of example the apparatus described in German Printed Application No. 2,220,819 may be cited along with the apparatuses disclosed in each of the following articles: (1) "Determination of Electrical Power for Floating Zone Melting of Different Materials," by V. I. Dobrovol Skaya and al. (Moscow Fiz Khim. Obrab. Mater 1973) (5), p.71–77; "Infrared T.V. System of Computer Controlled Czochralski Crystal Growth," by D. F. O'Kane and al., in J. Crystal Growth, vol. 13/14,1972, p.624; and "Automatic Crystal Pulling with Optical Diameter Control Using a Laser Beam," by U. Gross and al., in J. Crystal Growth, vol. 15, 1972, p.85. Difficulties arise from the fact that the shape and the volume of the zone of molten material are not independent parameters but, on the contrary, are related by fluid mechanic and thermodynamic relations which exist between the energy due to the internal forces and superficial energy.

In case of melting zone purification, for example, all changes in the parameters outside the range for which the energy balance of the floating zone remains possible lead either to solidification or to descent of the molten zone. It is only in the case where the surface tension/liquid density ratio is high that the extent of the control range is adequate. Thus, for liquids having high surface tensions and low densities, such as beryllium, boron, silicon and germanium, or certain compounds thereof, maintance and translation of the floating zone can be achieved without great difficulty.

It then suffices to provide a control assuring constant heat for obtaining ingots of acceptable cylindrical shape, although imperfect, after purifying by the melting zone technique.

On the other hand the results have nearly always been rather poor when this method is applied to heavy metals.

Likewise in the most complex case yet of directional solidification of a polyphase system, for example for producing composite materials as directionally solidified eutectic alloys, even the slightest modification of the shape, of the orientation, and/or the velocity of the forward progression of the solidification front, which could cause a discontinuity in the structure of the final composite material, must carefully be avoided. Once again it is necessary therefore to maintain the parameters of the floating zone, which fix the energy balance, inside a very narrow range which no currently known method actually permits.

Also in the case of crystal growth with crystal pulling where cylindrical crystals are desired from a monocrystalline nucleus (i.e., from a simple crystal) and a molten bath by means of the Czochralsky method, care must be taken in order to get crystals with a practically constant diameter conventionally this is achieved by holding the temperature gradient constant as well as the forward advance of the nucleation front. The shape and volume of the molten zone immediately adjacent to the crystal the course of its in-growth growth are in fact the determinant characteristics of the method. The contour of the molten zone must be tangent to the crystal nucleus and the nucleation front must be rigorously located thereat. But known methods for controlling these parameters are consonant with a complex apparatus and yield rather unsatisfactory results.

In an unexpected manner it has now been found that it is possible to control the bath of molten material, particularly for bringing about directional solidification by controlling a mechanical action due to the viscous friction liable to develop in the baths, in particular by detecting the energy consumed by the viscous friction and by controlling, accordingly, the heat supplied to the baths.

According to a first aspect, an object of the present invention is a method of controlling a bath of molten material, comprising controlling a mechanical action due to the viscous friction which is liable to develop in the bath.

More particularly, an object of the invention is a method of controlling a bath of molten material whereby the mechanical action controlled is viscous torque developed by the rotation of the bath of molten material relative to the solid portion of the material treated.

For the practical application of the method according to the invention, there may be employed for the control of the mechanical action due to viscous friction, for example at least one fluid bearing and thrust member, at least one fluid thrust bearing, or at least one magnetic bearing. The fluid thrust bearings are advantageously gas thrust bearings, the gas being air, hydrogen, argon, another inert gas or a mixture of gases; the gas of the gas thrust bearing may be independent of the atmosphere inside the material treatment chamber, but it is also possible for gas of the thrust bearing to mix with the atmosphere prevailing inside the chamber, i.e., the atmosphere in contact with the molten bath of material being controlled.

It is important for at least one of the means for detecting the mechanical action due to the viscous friction not to introduce any residual frictional torque of its own which is not insubstantial with respect to the variation in the torque due to the viscous friction in the molten bath itself which excludes the use of, for example, ball bearings. At least one of the detecting means must in fact be able to detect, with great accuracy, very small changes in torque.

The detection of the mechanical action is performed by means of conventional transducers which may be, for example, piezoelectric sensors, extens meters, optical torsion angle measuring devices, displacement detectors, highly sensitive motors or generators, electromagnetic compensation systems.

Once the mechanical action due to viscous friction is detected, it is possible to operate a heating unit which melts the bath, if necessary by means of a control system controlling the heating unit as soon as the data provided by the detecting means shows a significant error with respect to the set point.

According to a second aspect, an object of the invention is an apparatus for controlling a bath of molten material, comprising means for controlling a mechanical action due to the viscous friction which is liable to develop in the bath, namely means for detecting variations in the mechanical action and means for controlling as a consequence thereof the heating unit assuring the melting of the bath.

In accordance with a more particularly preferred mode of carrying out the invention, the apparatus for controlling the bath of molten material comprises means for keeping the material to be treated in constant rotation and means for detecting variations in a mechanical action due to the viscous friction liable to develop in the bath and means for controlling as a consequence thereof the heating unit which assures the melting of the bath.

The means for keeping the materials in constant rotation comprise, for example, a fluid bearing and a thrust member, a fluid thrust bearing, a ball thrust bearing, a magnetic bearing.

Means for detecting variations in a mechanical action due to the viscous friction liable to develop in the bath of molten material advantageously comprises a fluid bearing and a thrust member, a fluid thrust bearing, a magnetic bearing, as well as conventional transducers. Fluid thrust bearings such as defned hereinabove are particularly preferred.

The invention is illustrated in the accompanying drawings, in which.

Figure 1:
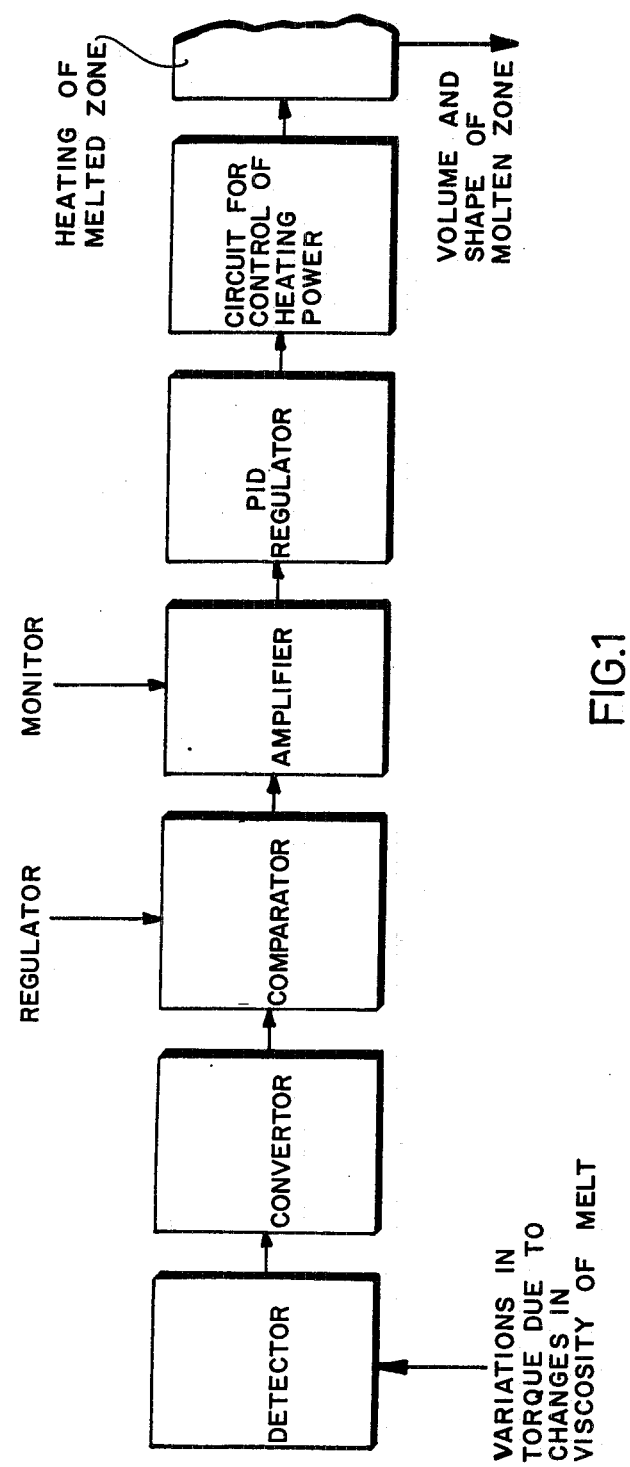
FIG. 1 shows a block diagram schematising a heating power control for the bath of molten material.

The apparatus according to the invention may be advantageously provided with an automatic control system for the heating power of the bath, under the control of the means for detecting variations of the mechanical action due to the viscous force, such as the type of system whose operation is schematized in FIG. 1. In such an automatic control system, the mechanical action due to the viscous force in the bath of molten material is detected and the value provided by the detecting means is converted in a convertor before being sent to a comparator means where the comparison with a set point such as a fixed command signal is effected. A significant error from the set point value puts a control actuating signal into action which may be of the on or off type, or the like in response to a monitor after amplification. The actuating signal preferably acts on a proportional plus integral plus derivative (PID) controller equipped with compensator so that the error between the detected value and the set value fluctuates in the vicinity of zero as damped oscillations. The controller operates on the power control circuit which controls the heating of the molten bath, thereby also controlling the volume and shape of the bath.

This type of automatic control system does not cause any particular difficulties in its realization and may be embodied by control devices known to the man in the art. There may also be associated with the system, if desired, a computer enabling the adjustment of the time constants of the controller and its compensator.

To better understand the operating principle which is at the heart of the present invention, reference will be made particularly to a floating zone control; it is readily apparent, however, that substantially equivalent considerations would equally apply to other types of molten baths, such as for example, baths for producing composite materials as directionally solidified eutectic alloys or for drawing cylindrical crystals in accordance with the Czochralsky method.

If we consider a floating zone held in equilibrium between two solid parts of a cylindrical ingot, we can, for the sake of simplification, formulate the hypothesis whereby the molten zone is cylindrical and of the same diameter as that of the ingot; this implies that the molten zone is of reduced height which can easily be obtained by means of any energy concentration means known to the man in the art. It can then be admitted that if a rotational movement is imparted, along the main axis to one of the parts of the ingot with a relative angular velocity $\omega$ and if R is the radius of the cylinder represented by the ingot, the torque resistance C due to the viscous force in the molten zone, having a coefficient of viscosity $\mu$ and a height e is given by the approximate expression:

$$C = \pi \omega R^4 / 2 \times (\mu / e) \tag{1}$$

According to the formulated hypothesis, torque C is indeed a function of the parameters $\mu$ and e. Now, the coefficient of viscosity $\mu$ is essentially decreasing function of the temperature according to a very approximate expression of the type $\mu T = $ constant, where T is the temperature. But in a floating zone of reduced height, the temperature can only be equal to or greater than the melting point of the material constituting the ingot, for, otherwise, the floating zone would solidify. Consequently, any increase in the height e of the molten zone can only be related to an increased, or at least unchanged, temperature and thereby to a decreased or unchanged coefficient of viscosity $\mu$. From the equation (1), it must be admitted that the parameters $\mu$ and e are not independent and that in the zone of reduced height, for which the equation (1) is a good approximation, $\mu$ and e vary inversely with respect to each other.

It is thus seen that the apparatus according to the invention which enables the control of the torque C, enables the control of the height of the molten zone, i.e., in practice, the volume thereof. The invention thereby automatically provides ingots of very high purity and of geometric regularity which was not possible heretofore.

During the treatment, according to the invention of molten baths for producing composite materials in the form of directionally solidified eutectic alloys, we can accomplish an exceptionally constant progression of the solidification front which is also held in shape. Unidirectional solidification of eutectics, particularly eutectics having a high melting point, may thus be rigorously performed.

It is also possible to effect, by means of the apparatus according to the invention, the control of a crystal drawing set up according to Czochralsky's method, so as to produce from a monocrystalline nucleus and a molten bath, a monocrystal of rigorously constant diameter.

EXAMPLE 1

Figure 2:
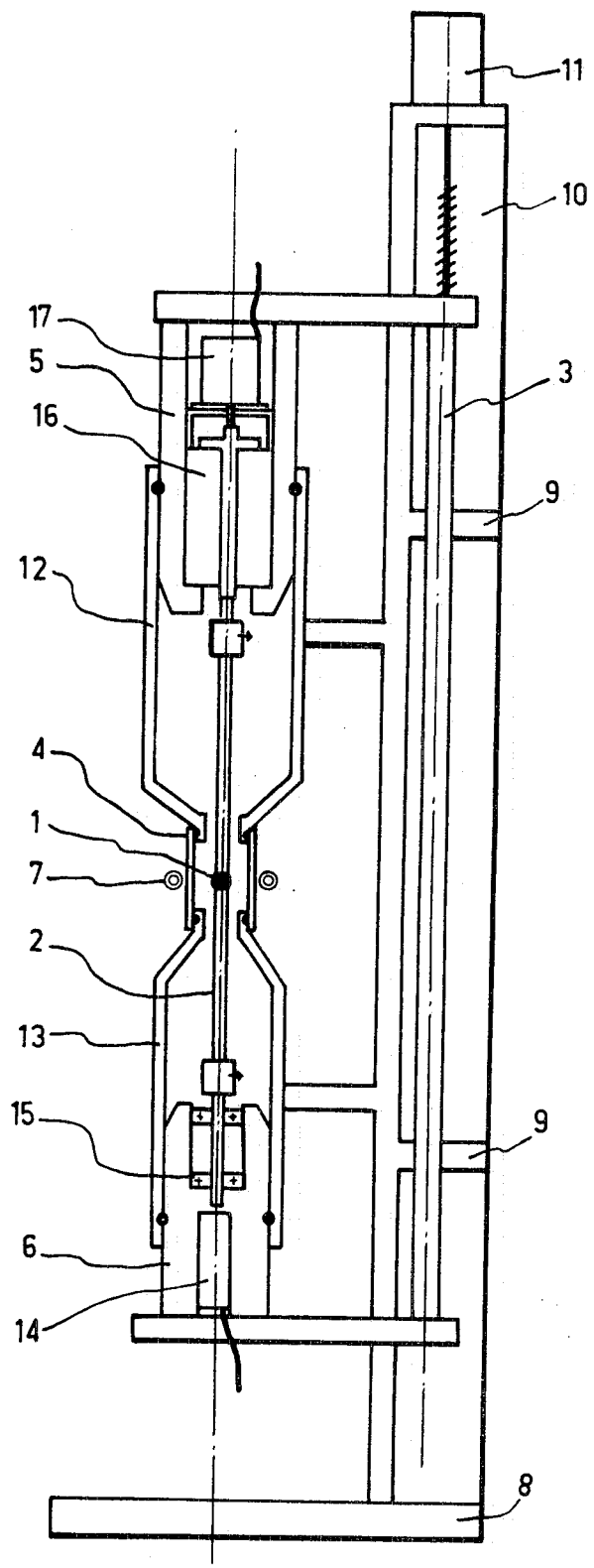
FIG. 2 shows vertical zone melting apparatus embodying the apparatus according to the invention.

A vertical melting zone apparatus is shown in FIG. 2 comprising a gas thrust bearing and a D.C. motor as means for detecting variations in a mechanical action resulting from viscous friction at the floating zone of the treated ingot.

Translatory movement of floating zone 1 along the cylindrical ingot 2 to be treated being provided by relative movement of slide 3, holders 5 and 6, with respect to high frequency current heating inductor 7. The inductor 7 is fixed; slide 3, guided on frame 8 by two guides 9, is driven in slow vertical translatory movement in response to the rotation of lead screw 10 coupled to motor and gear reduction unit 11.

The chucks or holders 5 and 6 are slidable in stationary guides 12 and 13.

A motor and gear reduction unit 14 with a slowly rotating output shaft permits homogenization of the liquid or molten phase at the solidification front, the translation of the molten zone along the ingot being in this case effected from the bottom to top. The lower part of the ingot 2 is guided in the holder 5 by a ball bearing 15.

A gas bearing 16 supports and guides the upper part of the ingot. The D.C. motor 17 associated with the gas bearing 16 assured a relatively high speed rotation and by means of variations in the power it consumes detected variations in the torque due to viscous friction which developed in the molten zone. The power consumed by the motor 17 converted into voltage was compared automatically to the fixed command signal or set point corresponding to the desired volume of the floating zone.

The heating unit for the molten zone was then controlled by the PID controller, with an interposed compensator, so that the error between the detected voltage and the set voltage changes with time in the vicinity of zero as damped oscillations, regardless of the nature of the disturbances which could effect the characteristic parameters of the molten zone.

It was thus possible to treat a variety of ingots of different materials and dimensions.

In the most unfavorable situations in which the ingot to the treated was of small diameter, i.e., in the order of 1 cm, and when the relative rotational speed of the two parts of the ingot was small, i.e., in the order of 50 rpm, for example, the torque resistance present in the molten zone and due to the viscous friction being very small (in the order of $10^{-2}$ gm. cm for molten metals), but is perfectly detectable by means of the gas thrust bearing and the D.C. motor which were used.

The cylindrical ingots obtained after melting in the floating zone in the above-described apparatus were of practically perfect cylindrical shape since the variations in the diameter of the ingot along the entire length were practically nil, reaching a maximum of 2%, which it thereof never exceeded except in the most unfavorable circumstances in which the metals or alloys had low surface tension/density ratios.

EXAMPLE 2

Apparatus similar to that of example 1 used except that the necessary technological adaptations which are within the skills of the man in the art for the control of a rigorously constant diameter crystal drawing setup starting with a monocrystalline nucleus and a molten bath according to the Czochralsky method. In order to make the entire arrangement perfectly operational, only a small computer was additionally provided, disposed in the control circuit which allowed variations in the volume of the bath to be taken into account, and especially the increase in volume of the crystal. In this way monocrystals of rigorously constant diameter were obtained from the starting material.

EXAMPLE 3

Figure 3:
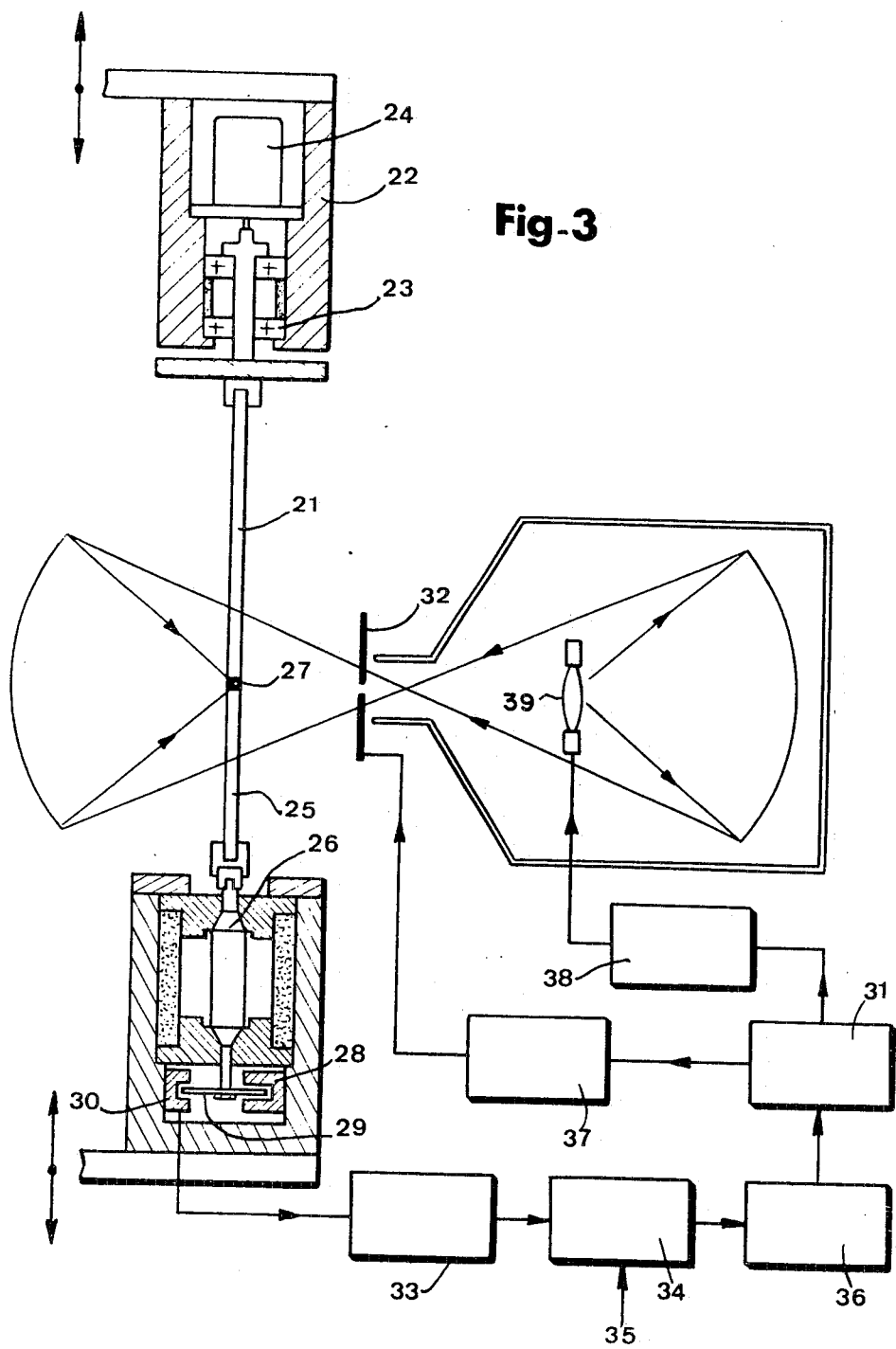
FIG. 3 shows a vertical melting zone apparatus embodying a preferred embodiment of the apparatus according to the invention.

A floating zone melting apparatus was constructed as illustrated in FIG. 3 using a mirror furnace as the melting zone heating unit.

The upper portion 21 of the processed bar is held and guided in spindle 22 by the abutment ball-bearing 23 and is rotated at a strictly constant speed by motor 24.

The lower portion of bar 25 is supported and guided by a double-acting gas abutment bearing 26. The rotating speed of the bar lower portion is slow as compared to that of the upper portion thereof. Its value results from equilibrium between the viscous friction torque established within the molten area by the rotation of the upper portion of the bar that is a motor torque for the lower portion and the resistive torque provided by an eddy-current brake consisting of electromagnet 28 and a disc 29.

The aforesaid disc is appertured so as to enable the rotational speed thereof to be measured by means of an optico-electronic sensor, the logical signals of which are converted to an analogical signal composable to a control command signal.

The viscous friction torque and thus the height of the malten area are controlled through the rotational speed of the lower portion of the bar, by means of a regulator acting upon the power emitted by mirror-furnace lamp 39 and upon diaphragm 32.

The entire regulating unit acting on the furnace is comprised of a logical analogical converter 33, a comparator 34 receiving a command 35, an amplifier 36, the regulator 31 (PID regulator, i.e., a regulator having a derivated, integral proportional action), a control device for diaphragm 37 and a power control device 38.

Such a device is of very high precision and enables a very low surface-tension and low dynamic viscosity material to be processed, while permitting a fairly large depth of melt area.

The apparatus according to the invention is nonetheless not limited to this form of the embodiment and it is obvious that one could just as easily use othe heating means, for example, high frequency current induction heating means.

What we claim is:

1. In the production of an ingot of fusible inorganic material by the moving melting zone method wherein a viscous molten zone is formed in a vertical ingot of said material and said zone is moved along said ingot thereby concentrating in said zone the impurities in said ingot, and the viscosity of the melt in said zone fluctuates as said zone is moved along said bar, the improvement which comprises: applying torque to one of the ends of said ingot thereby rotating said end about its axis at constant speed, continuously detecting variations in the viscous torque due to the viscous friction generated in said molten zone during the operational period of the heating cycle during which the molten zone is moved along the ingot, and increasing the temperature of said molten zone when said viscous torque increases and decreasing the temperature of said molten zone as said viscous torque decreases, thereby maintaining substantially constant (a) the torque on said end of said ingot and (b) the viscosity of said molten zone, and thereby producing a purified ingot of substantially uniform diameter.

2. The method according to claim 1 wherein the torque is applied to the upper end of said ingot.

3. The method according to claim 1 wherein the lower end of said ingot is a pulled-out portion of a viscous melt.

4. The method according to claim 1 wherein the ingot has two free ends, and the lower end is rotated slowly to promote homogeneity of said molten zone.

5. The method according to claim 1 wherein one end of said ingot rotates at a speed more than 50 r.p.m. in excess of the other.

6. The method according to claim 1 wherein the torque is applied to one of the ends of said ingot by a direct current electric motor, said molten zone is formed by induction heating of the ingot, the variations in the viscous torque generated in said zone are detected, and the current supplied to the motor and to the induction heater is increased as the viscous torque on the rod increases and is decreased as the visous torque on the ingot decreases.

7. The method according to claim 1 whereby the current supplied to said motor and said heater are each determined automatically in amounts respectively sufficient to maintain the rotational torque and viscosity of the molten zone substantially constant.

8. The method according to claim 1 further comprising detecting said viscous torque and converting it so as to provide information for a command set point.

9. The method according to claim 8 wherein an "on or off" type control is provided.

10. The method according to claim 8 wherein an analog type control is provided.

11. In the production of a high purity crystal by the Czochralsky method, wherein a seed crystal is dipped into a viscous melt of the material to be crystallized and is then slowly lifted thereby forming a vertical crystalline column of said melt, the improvement which comprises: applying torque to the seed crystal end of said crystal thereby rotating said crystalline column about its vertical axis at constant speed, continuously detecting variations in the viscous torque due to the viscous friction generated in said melt by said rotation during the lifting period of the heating cycle, and increasing the heat applied to said melt when said viscous torque increases and decreasing said heat when said viscous torque decreases, thereby maintaining substantially constant the torque on said crystal and the viscosity of said bath, and thereby producing a columnar crystal of uniform diameter.

12. The method according to claim 11 wherein said increase and said decrease in said heat are performed automatically.

* * * * *

UNITED STATES PATENT AND TRADEMARK OFFICE
CERTIFICATE OF CORRECTION

PATENT NO. : 4,176,002
DATED : November 27, 1979
INVENTOR(S) : JEAN-MICHEL QUENISSET ET AL.

It is certified that error appears in the above—identified patent and that said Letters Patent is hereby corrected as shown below:

Column 1, line 19: "entectic" should read -- eutectic --.

Column 4, line 60: The equation (1) should read $$-- \quad C = \frac{\pi \omega R^4}{2} \times \frac{\mu}{e} \quad --.$$

Column 6, line 62: "malten" should read -- molten --.

Column 7, line 10: "othe" should read -- other --.

*Signed and Sealed this*

*Twenty-fourth* Day of *November 1981*

[SEAL]

*Attest:*

GERALD J. MOSSINGHOFF

*Attesting Officer*     *Commissioner of Patents and Trademarks*

UNITED STATES PATENT AND TRADEMARK OFFICE
CERTIFICATE OF CORRECTION

PATENT NO. : 4,176,002
DATED : Nov. 27, 1979
INVENTOR(S) : JEAN-MICHEL QUENISSET et al

It is certified that error appears in the above-identified patent and that said Letters Patent are hereby corrected as shown below:

On the title page

[75] "Rober Naslain" should be --Roger Naslain--

Signed and Sealed this

Eighteenth Day of January 1983

[SEAL]

Attest:

GERALD J. MOSSINGHOFF

Attesting Officer      Commissioner of Patents and Trademarks